US006805278B1

(12) United States Patent
Olson et al.

(10) Patent No.: US 6,805,278 B1
(45) Date of Patent: Oct. 19, 2004

(54) SELF-CENTERING CONNECTOR WITH HOLD DOWN

(75) Inventors: Stanley W. Olson, East Berlin, PA (US); Joseph B. Shuey, Camp Hill, PA (US)

(73) Assignee: FCI America Technology, Inc., Reno, NV (US)

( * ) Notice: Subject to any disclaimer, the term of this patent is extended or adjusted under 35 U.S.C. 154(b) by 0 days.

(21) Appl. No.: 09/691,811

(22) Filed: Oct. 19, 2000

Related U.S. Application Data

(60) Provisional application No. 60/160,482, filed on Oct. 19, 1999.

(51) Int. Cl.[7] .................................................. H05K 1/00

(52) U.S. Cl. .................................... 228/180.22; 439/83

(58) Field of Search .......................... 439/83, 876, 566; 228/180.21, 180.22; 257/738; 438/455

(56) References Cited

U.S. PATENT DOCUMENTS

| | | | | |
|---|---|---|---|---|
| 4,217,024 A | | 8/1980 | Aldridge et al. | 339/275 |
| 4,536,955 A | | 8/1985 | Gudgeon | 29/840 |
| 4,767,344 A | | 8/1988 | Noschese | 439/83 |
| 4,878,611 A | * | 11/1989 | LoVasco et al. | |
| 5,086,966 A | | 2/1992 | Melton et al. | 228/208 |
| 5,214,308 A | * | 5/1993 | Nishiguchi et al. | |
| 5,261,593 A | | 11/1993 | Casson et al. | 228/180.22 |

(List continued on next page.)

FOREIGN PATENT DOCUMENTS

| | | | |
|---|---|---|---|
| EP | 0 789 422 A2 | | 8/1997 |
| JP | 2-28990 | * | 2/1990 |

(List continued on next page.)

OTHER PUBLICATIONS

U.S. Provisional application No. 60/160,482, filed Oct. 19, 1999.

(List continued on next page.)

*Primary Examiner*—Neil Abrams
(74) *Attorney, Agent, or Firm*—Woodcock Washburn LLP

(57) ABSTRACT

An electrical connector mountable to a substrate. The electrical connector comprises a housing, a surface mount contact secured to the housing and adapted to surface mount to the substrate, and a non-surface mount hold down secured to the housing and adapted to mount to the substrate. The surface mount contact includes a fusible element, for example, a solder ball, a plurality of which may form a matrix array. The connector may be a ball grid array connector. A method of mounting an electrical connector to a substrate. The method comprises providing a substrate, and an electrical connector having a contact and a hold down. The method further comprises securing the contact to the substrate, placing the hold down into the substrate, and securing the hold down to the substrate. A method of preventing the skewing of an electrical connector when being mounted to a substrate. The method further comprises providing an electrical connector having a first part with a mass greater than a second part, and balancing the first and second parts of the electrical connector such that the electrical connector remains substantially parallel to the substrate when mounting to the substrate. An electrical connector mountable to a substrate. The electrical connector comprises a housing having a mounting end facing the substrate, and a plurality of contacts secured to the housing. The electrical connector further comprises a plurality of fusible elements, each secured to a respective one of the plurality of contacts, and a standoff extending a distance from the mounting end of the housing. An improved ball grid array connector mountable to a substrate. The improvement comprises a hold-down adapted to enter an opening in the substrate. The hold-down may be adapted to enter the opening without an interference fit

5 Claims, 12 Drawing Sheets

U.S. PATENT DOCUMENTS

| | | | | | |
|---|---|---|---|---|---|
| 5,490,040 | A | * | 2/1996 | Gaudenzi et al. | 361/773 |
| 5,637,008 | A | | 6/1997 | Kozel | 439/342 |
| 5,691,041 | A | | 11/1997 | Frankeny et al. | 428/209 |
| 5,729,896 | A | | 3/1998 | Dalal et al. | 29/840 |
| 5,735,452 | A | | 4/1998 | Yu et al. | 228/254 |
| 5,742,484 | A | | 4/1998 | Gillette et al. | 361/789 |
| 5,743,009 | A | | 4/1998 | Matsui et al. | 29/843 |
| 5,751,556 | A | | 5/1998 | Butler et al. | 361/773 |
| 5,755,595 | A | | 5/1998 | Davis et al. | 439/607 |
| 5,772,451 | A | | 6/1998 | Dozier, II et al. | 439/70 |
| 5,796,590 | A | | 8/1998 | Klein | 361/774 |
| 5,810,607 | A | | 9/1998 | Shih et al. | 439/66 |
| 5,831,825 | A | | 11/1998 | Fromont | 361/719 |
| 5,874,776 | A | | 2/1999 | Kresge et al. | 257/747 |
| 5,876,219 | A | | 3/1999 | Taylor et al. | 439/74 |
| 5,883,782 | A | | 3/1999 | Thurston et al. | 364/704 |
| 5,888,884 | A | | 3/1999 | Wojnarowski | 438/462 |
| 5,893,725 | A | | 4/1999 | Bhansali | 438/108 |
| 5,919,050 | A | | 7/1999 | Kehley et al. | 439/71 |
| 5,938,451 | A | | 8/1999 | Rathburn | 439/66 |
| 5,955,888 | A | | 9/1999 | Frederickson et al. | 324/761 |
| 5,969,945 | A | | 10/1999 | Cutting et al. | 361/704 |
| 5,978,229 | A | | 11/1999 | Kim | 361/760 |
| 5,984,726 | A | | 11/1999 | Wu | 439/607 |
| 6,012,948 | A | | 1/2000 | Wu | 439/567 |
| 6,037,044 | A | | 3/2000 | Giri et al. | 428/209 |
| 6,089,878 | A | | 7/2000 | Meng | 439/79 |
| 6,116,926 | A | | 9/2000 | Ortega et al. | 439/108 |
| 6,152,756 | A | * | 11/2000 | Huang et al. | 439/83 |
| 6,174,198 | B1 | | 1/2001 | Wu et al. | 439/541.5 |
| 6,183,301 | B1 | | 2/2001 | Paagman | 439/608 |
| 6,196,871 | B1 | * | 3/2001 | Szu | 439/876 |
| 6,220,895 | B1 | | 4/2001 | Lin | 439/607 |
| 6,325,644 | B1 | | 12/2001 | Lemke et al. | 439/83 |
| 6,529,385 | B1 | | 3/2003 | Brady et al. | 361/766 |
| 6,544,046 | B1 | | 4/2003 | Hahn et al. | 439/83 |

FOREIGN PATENT DOCUMENTS

| | | |
|---|---|---|
| JP | 08125379 | 5/1996 |
| WO | PCT/CH97/00184 | 5/1997 |
| WO | PCT/US97/08783 | 5/1997 |
| WO | PCT/US97/18066 | 10/1997 |
| WO | WO98/15991 | 10/1997 |
| WO | WO97/43885 | 11/1997 |
| WO | WO97/44859 | 11/1997 |
| WO | WO98/15989 | 4/1998 |

OTHER PUBLICATIONS

U.S. Non–Provisional application No. 60/302,027, filed Apr. 29, 1999.

* cited by examiner

SELF-CENTERING CONNECTOR WITH HOLD DOWN

CROSS-REFERENCE TO RELATED APPLICATION

This application claims priority under 35 U.S.C. § 119(e) to U.S. Provisional Patent Applications Ser. No. 60/160,482, which was filed on Oct. 19, 1999. In addition, the subject matter disclosed herein is related to the subject matter disclosed in application Ser. No. 09/692,529, filed on Oct. 19, 2000. Both applications are herein incorporated by reference.

BACKGROUND OF THE INVENTION

1. Field of the Invention

The invention relates to electrical connectors. More specifically, the invention relates to electrical connectors with strain relief features.

2. Brief Description of Earlier Developments

Various types of electrical connectors rely upon surface mount technology (SMT) to secure the connector's contacts to an underlying substrate. SMT connectors provide numerous benefits over earlier connectors, such as simplified manufacturing and lower costs.

While providing such advantages, the use of SMT may raise other issues. One concern, for example, involves the ability of the solderjoint between the contact and the underlying substrate to absorb forces caused by, for example, shipping, handling, mating and thermal cycling. Should one solderjoint become unusable as a result of damage from any of these events, the entire connector adversely may be affected.

Ball grid array (BGA) technology is one type of SMT. Generally speaking, an electrical connector using a BGA has a housing with a contact therein. A fusible element, typically a solder ball, secures to each contact. The solder balls serve as the primary connection between the contact and the surface of the substrate. A reflow process fuses the solder ball to the substrate. During the reflow process, a beneficial "self-centering" feature of BGA technology occurs. Specifically, as the solder reflows, the surface tension of the solder helps to align the connector properly with the conductive pads on the underlying substrate.

As with SMT connectors, forces on the solder joint in a BGA connector also poses a concern. Because of the self-centering ability of BGA connectors, however, many of the solutions used in SMT connectors cannot be used on BGA connectors. Therefore, a need exists to develop techniques for providing strain relief to BGA connectors.

SUMMARY OF THE INVENTION

The invention overcomes the above-mentioned limitations in the earlier developments and provides techniques for providing strain relief to BGA connectors. In particular, the invention provides a connector body with a retention post that may be inserted into a through hole in a printed circuit board (PCB). The post fits in the through hole without an interference fit. The post diverts some of the forces acting on the solder joint between the contacts and the PCB pads by allowing the connector body and the PCB to absorb some of the forces.

It is an object of the invention to provide an electrical connector with strain relief features.

It is a further object of the invention to provide a ball grid array electrical connector with strain relief features.

It is a further object of the invention to provide strain relief features to a ball grid array electrical connector compatible with the self-centering capability of the connector.

It is a further object of the invention to provide an electrical connector made with simplified manufacturing steps.

These and other objects of the invention are achieved in one aspect of the invention by an electrical connector mountable to a substrate. The electrical connector comprises a housing, a surface mount contact secured to the housing and adapted to surface mount to the substrate, and a non-surface mount hold down secured to the housing and adapted to mount to the substrate. The surface mount contact includes a fusible element, for example, a solder ball, a plurality of which may form a matrix array. The electrical connector is constructed such that it remains substantially parallel when mounted to the substrate. The electrical connector may further comprise a standoff secured to the housing. The standoff is adapted to retain the housing a distance from a surface of the substrate or to limit flattening of a solderjoint between the surface mount contact and the substrate. The standoff may be a part of the hold-down. The non-surface mount hold down of the electrical connector may be a post extending outwardly from the housing and is adapted to enter a hole in the substrate.

These and other objects of the invention are achieved in another aspect of the invention by a ball grid array connector mountable to a substrate. The ball grid array comprises a housing and a plurality of contacts within the housing. The ball grid array further comprises a plurality of fusible elements secured to the contacts for mounting the connector to the substrate, and a hold down adapted to enter the substrate. The hold down is secured to the housing. The ball grid array connector may further comprise a standoff extending from the housing and adapted to retain the housing a distance from a surface of the substrate or to limit flattening of the fusible elements during reflow. The standoff may be a part of the hold-down. The hold down may be a post extending outwardly from the housing. The fusible elements may be solder balls. Furthermore, the ball grid array connector may be constructed such that it remains substantially parallel when mounted to the substrate.

These and other objects of the invention are achieved in another aspect of the invention by a method of mounting an electrical connector to a substrate. The method comprises providing a substrate, and an electrical connector having a contact and a hold down. The electrical connector may be a ball grid array connector. The method further comprises securing the contact to the substrate, placing the hold down into the substrate, and securing the hold down to the substrate. The securing may comprise soldering the hold down to the substrate. The method may further comprise constructing the electrical connector such that it remains substantially parallel when mounted to the substrate. Also, the method may comprise balancing the electrical connector on the substrate such that the electrical connector remains substantially parallel to the substrate during the securing. Furthermore, the securing of the contact may occur before the securing of the hold down.

These and other objects of the invention are achieved in another aspect of the invention by a method of preventing the skewing of an electrical connector when being mounted to a substrate. The method comprises providing an electrical connector having a first part with a mass greater than a second part, and balancing the first and second parts of the electrical connector such that the electrical connector remains substantially parallel to the substrate when mounting to the substrate. The balancing may comprise removing material from the first part of the electrical connector and/or adding material to the second part of the electrical connector. The electrical connector may be a ball grid array connector.

These and other objects of the invention are achieved in another aspect of the invention by an electrical connector mountable to a substrate. The electrical connector comprises a housing having a mounting end facing the substrate, and a plurality of contacts secured to the housing. The electrical connector further comprises a plurality of fusible elements, each secured to a respective one of the plurality of contacts, and a standoff extending a distance from the mounting end of the housing. The standoff may allow partial flattening of the fusible elements. The distance may be selected so as to limit flattening of the fusible elements during reflow, or to prevent bridging between adjacent fusible elements. The fusible elements may be, for example, solder balls.

These and other objects of the invention are achieved in another aspect of the invention by an improved ball grid array connector mountable to a substrate. The improvement comprises a hold-down adapted to enter an opening in the substrate. The hold-down may be adapted to enter the opening without an interference fit.

BRIEF DESCRIPTION OF THE DRAWINGS

Other uses and advantages of the invention will become apparent to those skilled in the art upon reference to the specification and the drawings, in which.

DETAILED DESCRIPTION OF THE PREFERRED EMBODIMENTS

Each of the alternative embodiments described herein relate to surface mounted electrical connectors having strain relief features. Preferably, fusible elements, such as solder balls, secure the contacts to conductive elements on the substrate using ball grid array (BGA) technology. Because BGA connectors tend to precisely align relative to the conductive pads on the substrate during reflow (known as the "self-centering"), the strain relief features discussed herein preferably do not interfere with this desirable characteristic. An intrusive reflow is preferably used to secure the strain relief to the substrate. "Intrusive" refers to the placement of fusible material (e.g., solder paste) within an opening in the substrate (e.g., plated through hole). Each alternative embodiment will now be described in more detail below.

Figure 1:
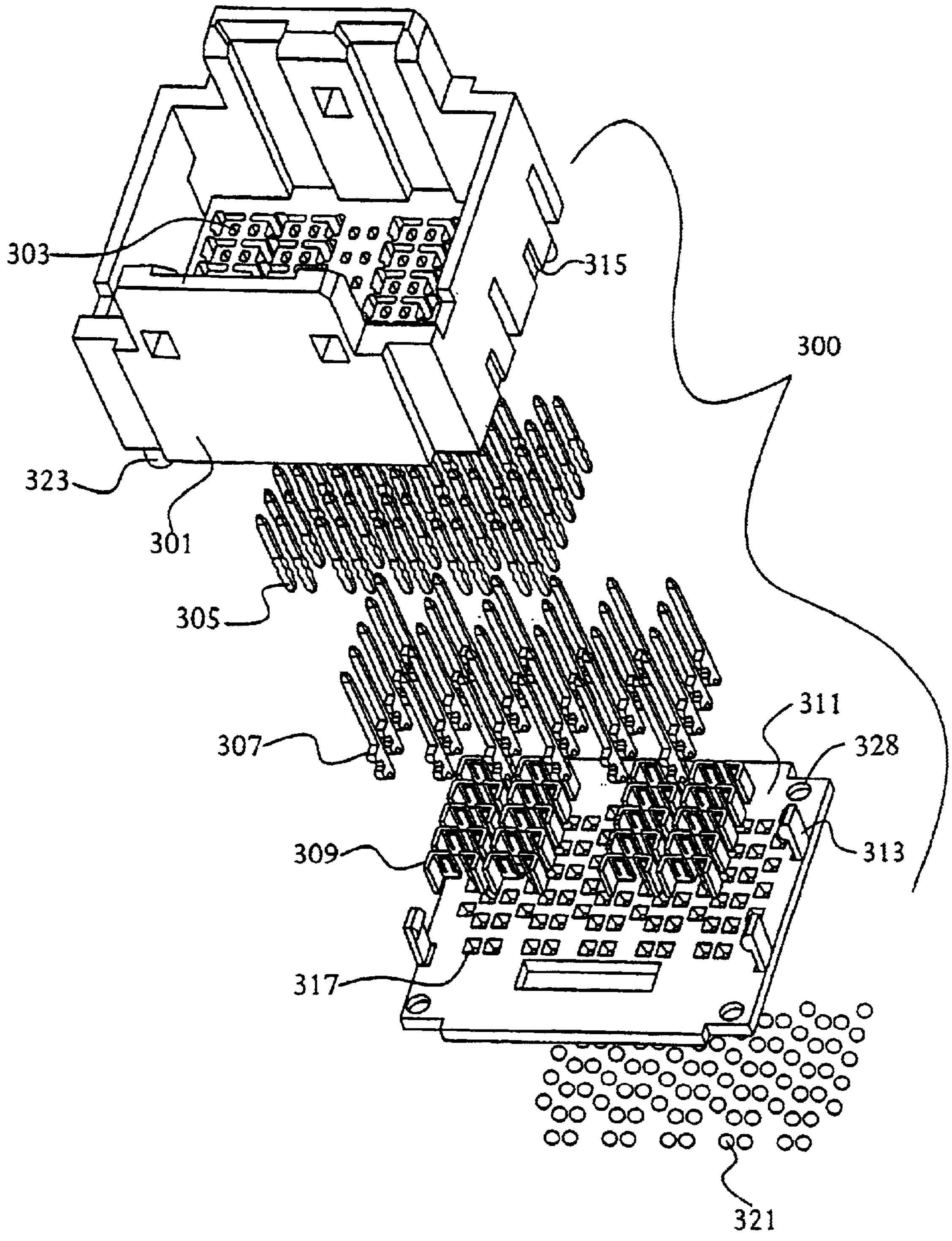
FIG. 1 is an exploded, top perspective view of a first alternative embodiment of the invention.
Figure 2A:
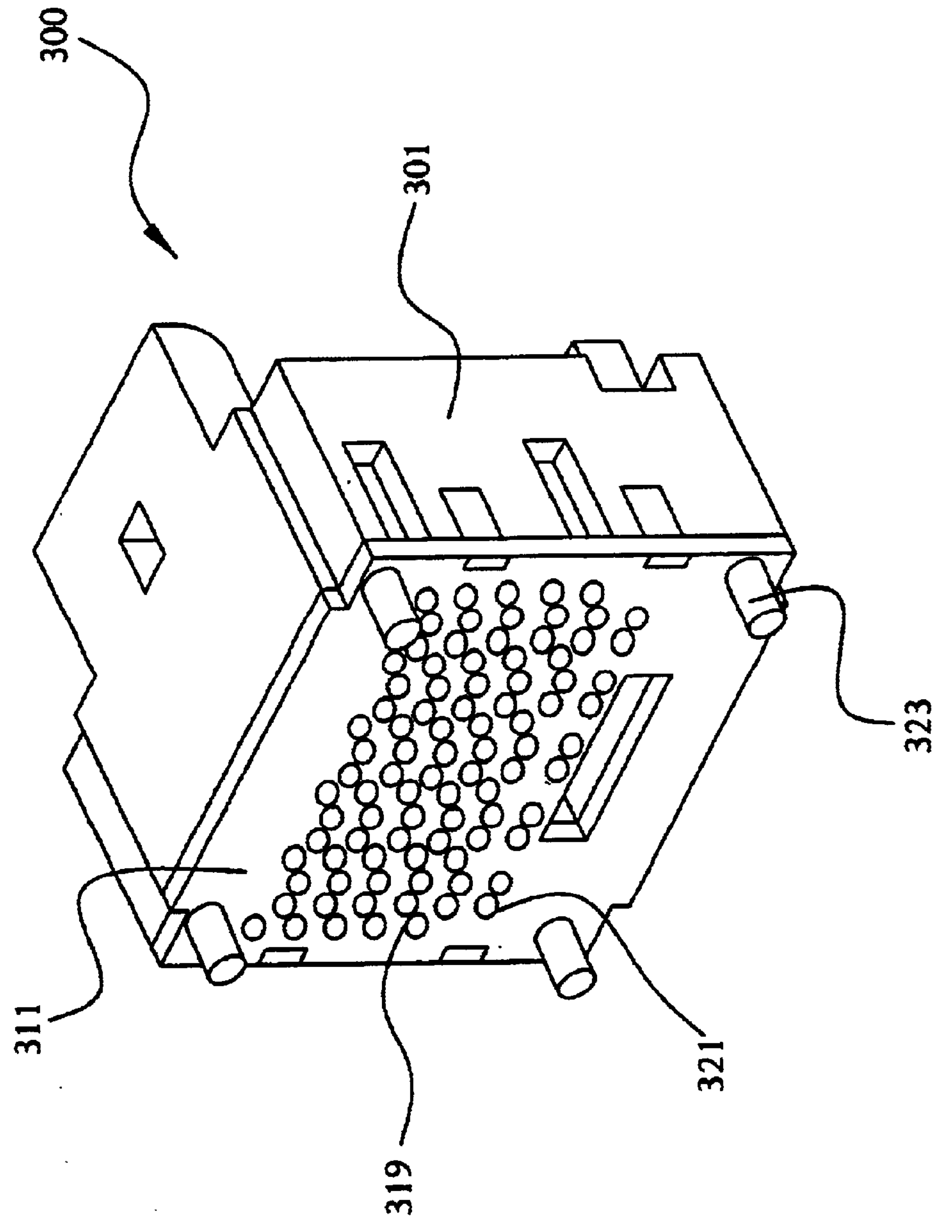
FIG. 2A is a bottom, perspective view of the electrical connector in FIG. 1.
Figure 2B:
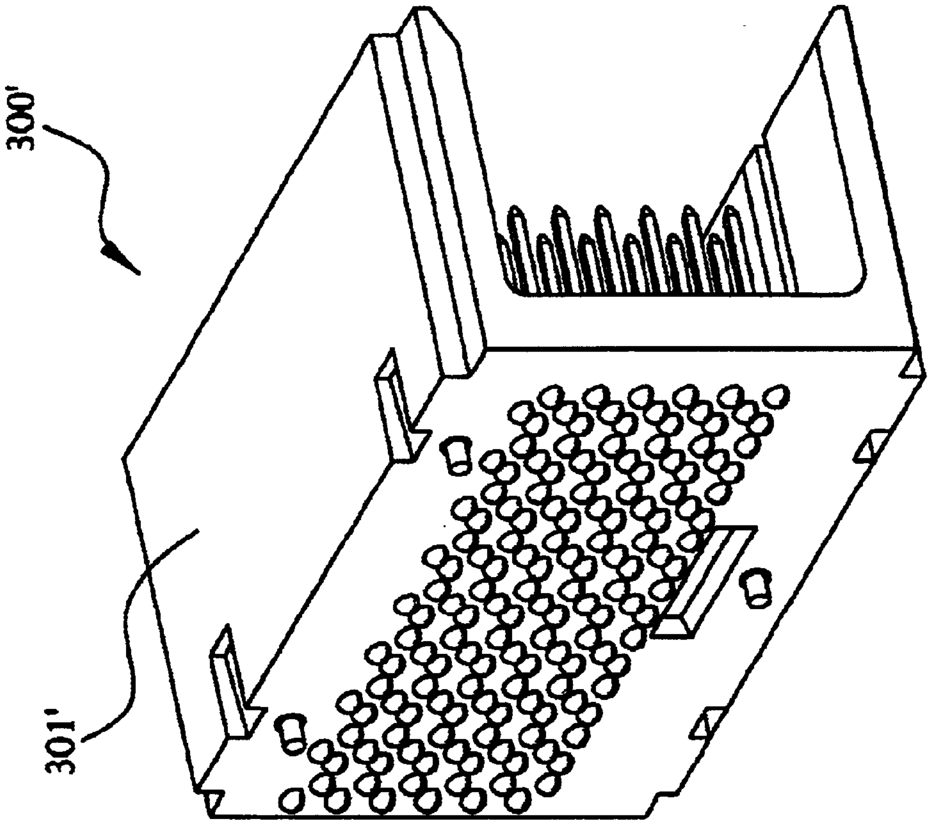
FIG. 2B is a bottom, perspective view of an alternative embodiment of the electrical connector in FIG. 1.
Figure 3:
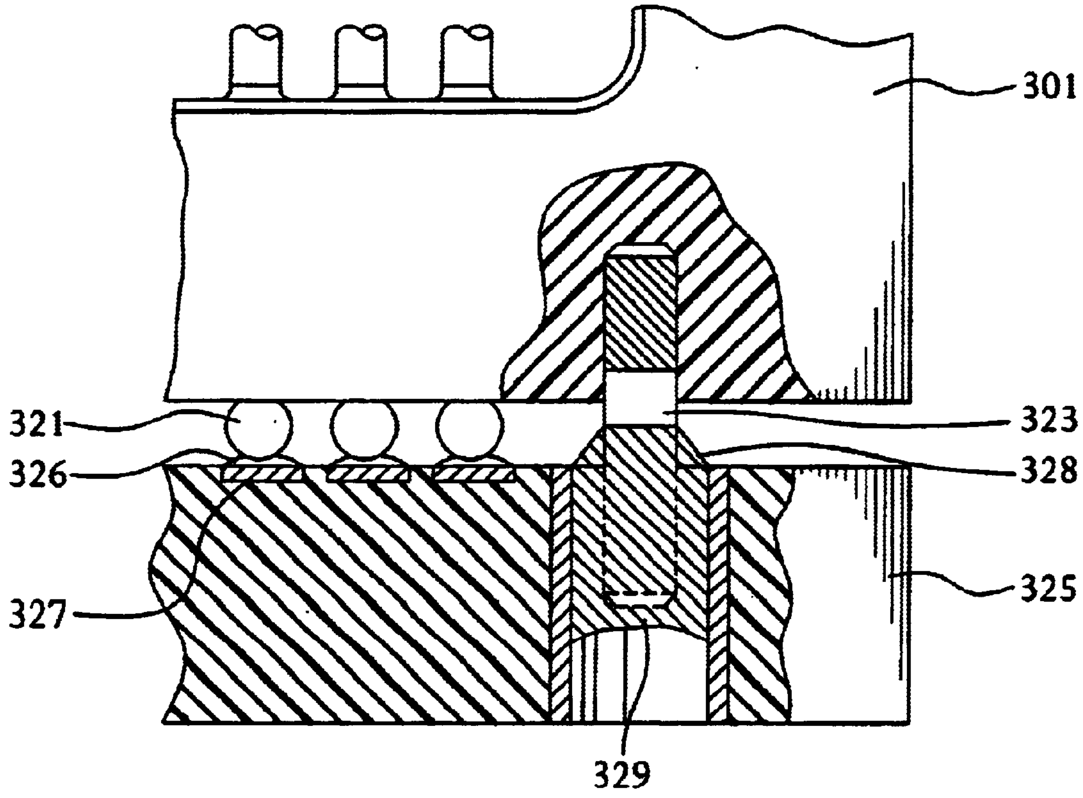
FIG. 3 is a partial cut-away view of the electrical connector in FIG. 1.
Figure 5:
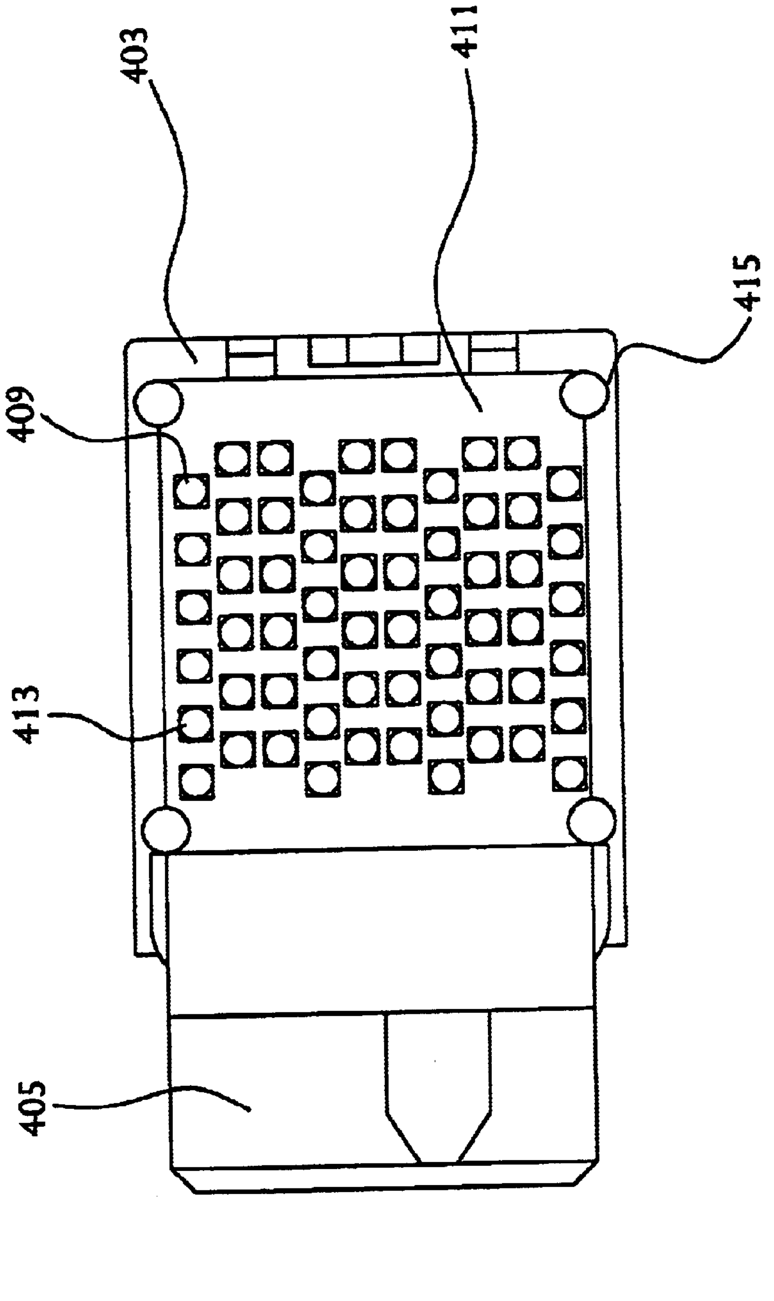
FIG. 5 is a bottom view of the electrical connector in FIG. 4.

FIGS. 1–3 display electrical connector 300. Connector 300 is a backplane header connector that preferably mates with a backplane receptacle connector (as shown in FIG. 5). Connector 300 can be used in a backplane system for example, to connect a daughtercard to a motherboard.

Connector 300 uses many of the features described in U.S. patent application Ser. No. 09/302,027, herein incorporated by reference. Accordingly, only a brief discussion of certain features of connector 300 is necessary for an understanding of the invention.

Figure 4:
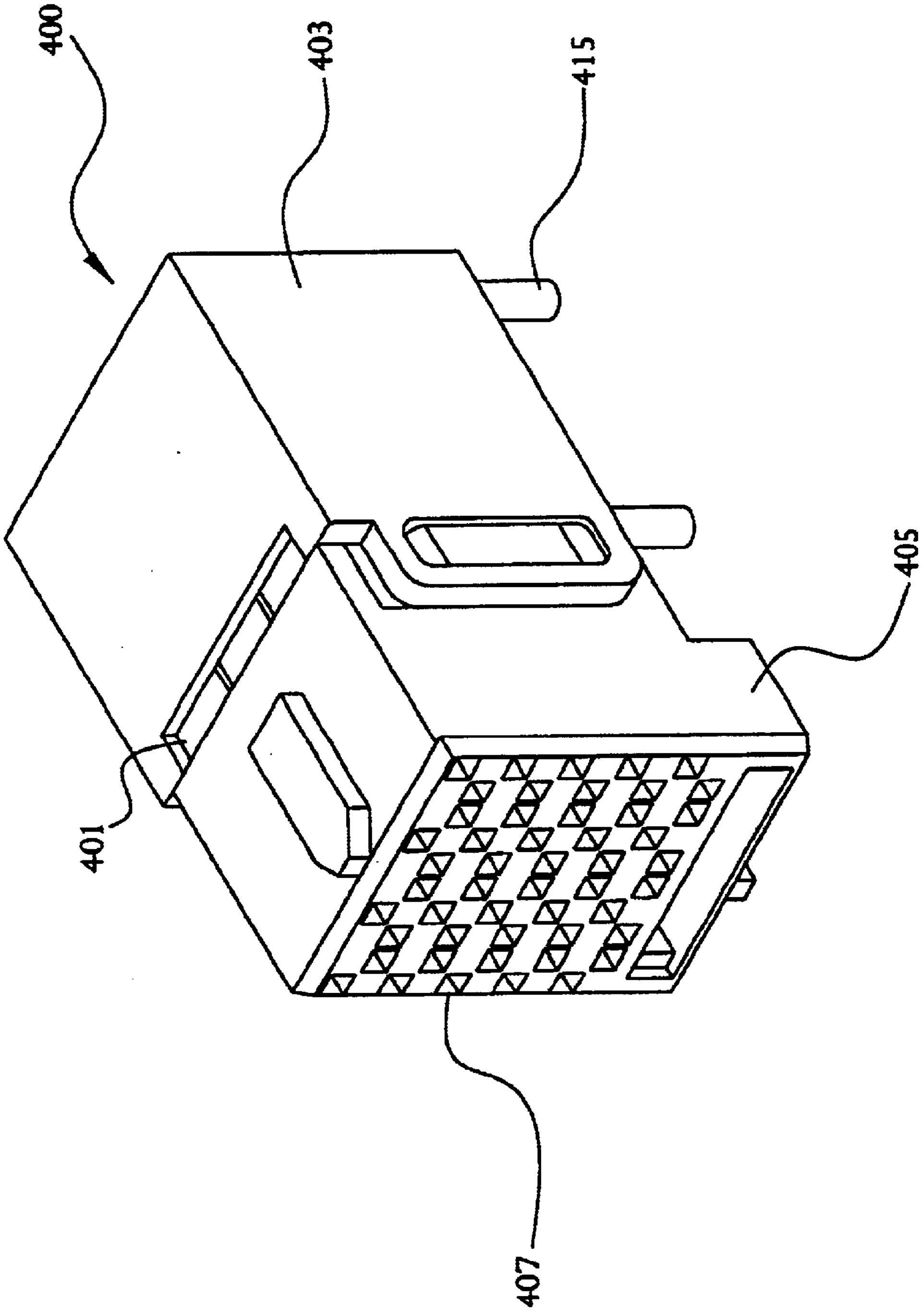
FIG. 4 is a top perspective view of a second alternative embodiment of the invention.

Connector 300 includes an insulative housing 301 with apertures 303 therethrough that accept signal contacts 305, ground contacts 307 and ground shields 309. The mating ends of signal contacts 305 and ground contacts 307 extend through housing 301 and correspond to the arrangement of lead-in apertures in a mating connector (as shown in FIG. 4). Ground shields 309 preferably remain within housing 301, engage ground contacts 307 and act to surround signal contacts 305 in a differential pairing arrangement.

Connector 300 surface mounts to a substrate 325, preferably using the BGA technology discussed in International Publication number WO 98/15991. This aspect of the invention differs from the through hole mounting of the contacts described in U.S. patent application Ser. No. 09/302,027.

In one possible manner of surface mounting, connector 300 could use a wafer 311 that latches to housing 301. Wafer 311 could have latch arms 313 that engage suitable latch structure 315 on housing 301. In addition, wafer 311 has apertures 317 therethrough corresponding to the locations of contacts 305, 307. Specifically, the distal ends of contacts 305, 307 extend through apertures 317. The distal ends of contacts 305, 307 preferably reside within apertures 317, but could extend beyond apertures 317.

In a manner similar to that described in International Publication number WO 98/15991, pockets on the bottom surface of wafer 311 can receive solder paste (not shown) provided during a squeegee operation. Thereafter, the pockets now filled with solder paste can receive, and temporarily retain, a fusible element 321. A reflow operation then fuses solder balls 321 to contacts 305, 307. Any other manner of securing fusible elements 321 to contacts 305, 307 could be used, however.

FIG. 2B provides an alternative embodiment of connector 300. As shown in FIG. 2B, housing 301' of connector 300' is a single continuous structure. This is to be distinguished from connector 300, as shown in FIG. 2A, where wafer 311 is shown as a separate portion of housing 301.

Connector 300 can mount to substrate 325 having an array of conductive pads 327 connected to suitable traces (not shown) to transmit signals or for grounding purposes, for example. Pads 327 correspond to the array of fusible elements 321 secured to contacts 305, 307 on connector 300. As an alternative, pads 327 could also be vias.

A reflow process, typically subsequent to the reflow process that fused solder balls 321 to contacts 305, 307, fuses solder balls 321 to pads 327. Typically, the pads have solder paste 326 thereon to accept and to temporarily secure solder balls 321 to substrate 325. As described earlier, a squeegee drawn across a stencil (not shown) placed on the substrate provides suitable amounts of solder paste at desired locations. The reflow process fuses solder ball 321 to pad 327 on substrate 325, thus creating an electrical path between contacts 305, 307 and substrate 325.

Due to the mechanical loading requirements and durability requirement of backplane connectors, connector 300 may require strain relief features to protect the solder joints formed by solder balls 321. Connector 300 may use intrusively reflowed hold downs. Housing 301 includes posts 323 adjacent to the four corners, or at any other suitable location.

When assembled, posts 323 extend past wafer 311 and reside within through holes 328 in substrate 325. Preferably, posts 323 are made from a suitable solderable material, such as a metal or a metallized plastic. Significantly, the diameter of post 323 is smaller than the diameter of plated through hole 328 that receives post 323. Stated differently, posts 323 are generally unrestrained within through holes 328 before the reflow step. This allows solder balls 321 to self-center upon reflow without interference. Despite the ability of posts 323 to move within through holes 328, posts 323 do, however, provide rough alignment and guidance when placing connector 300 on substrate 325.

The reflow process used to secure solder balls 321 to substrate 325 preferably also secures posts 323 to through hole 328 in substrate 325. As with conductive pads 327, through holes 328 receive solder paste 329 during the squeegee operation. The reflow process fuses posts 323 to substrate 325.

Posts 323 serve as the strain relief for connector 300. Despite being an intrusive hold down, posts 323 allow solder balls 321 to self-centered during reflow. Prior to the reflow process, posts 323 extend into solder paste-filled tough holes 328, while solder balls 321 rest upon solder paste 326 on conductive pads 327. During the heating stage of the reflow process, solder paste 326 tends to liquefy before solder balls 321.

While liquid, solder balls 321 will self-center relative to conductive pads 327 on substrate 325. Posts 323, being smaller than through holes 328, allows movement of connector 300 without interference.

At the end of the reflow process, posts 323 tend to cool more slowly than solder balls 321. As a result, the solder in this area stays liquid longer. This allows the benefit of an intrusive hold down, while retaining the self-centering characteristic of solder balls 321.

FIG. 3 is a partial cut-away view of connector 300 providing greater detail of the construction and application of post 323. As shown in FIG. 3, post 323 is fixedly attached to connector 300, such as by placing a knurled section of post 323 into an opening in housing 301 after stenciling the solder paste. As connector 301 is placed upon substrate 325, post 323 passes into through hole 328 in substrate 325. Also, solder balls 321 align with conductive traces 327 on substrate 325. Solder balls 321 rest on solder paste 326 placed on conductive traces 327. Similarly, post 323 resides within solder paste 329 located in through hole 328. As the connector system is heated, solder balls 321 liquify electrically couple to conductive pads 327, and post 323 attaches to the interior of through hole 328.

The system also may be designed such that post 323 secures to through hole 328 after solder balls 321 fuses to conductive pads 327. In this way, post 323 also will provide strain relief to the connector system without inhibiting the self-centering characteristics of the BGA connector. The diameters of post 323 and through hole 328 are sized and toleranced so as to reduce any interference with the self-centering action of the BGA attachment techniques, while also ensuring hat solder balls 321 initially engage at least a portion of solder pad 327. Also, the protrusion of post 323 into through hole 328 is such that optimum fillets will be formed inside and above through hole 328 without restricting the self-centering action. Post 323 is sized such that a significant amount of solder paste 329 will not be forced out of through hole 328 during the mounting process. For example, FIG. 3 shows that post 323 extends approximately halfway into through hole 328.

FIGS. 4 and 5 display electrical connector 400. Receptacle backplane connector 400 uses many of the features described in U.S. Pat. No. 6,116,926, herein incorporated by reference. Because a detailed discussion of many of the features of connector 400 are unnecessary for an understanding of the invention, only a brief summary of these features follows.

Connector 400 is modular, formed by a series of sub-assemblies 401. Rear insulative housing 403 and front insulative housing 405 can latch together and surround sub-assemblies 401 to form connector 400. Front housing 405 includes lead-in openings 407 that accept conductive contacts 305, 307 from mating connector 300 (as shown in FIG. 1). As shown, openings 407 form a differential pair arrangement.

Sub-assemblies 401 contain the ground and signal contacts (not shown). The ground and signal contacts mate with corresponding ground contacts 307 and signal conts 305 of mating connector 300 (as shown in FIG. 1). Differently than shown in U.S. Pat. No. 6,116,926, the contacts of connector 400 surface mount to a substrate (not shown).

In one possible manner of surface mounting, connector 400 could use a wafer 411 that latches to housing 401. Wafer 411 could have latch arms (not shown) that engage suitable latch structure (not shown) on housing 401. In addition, wafer 411 has apertures 413 therethrough corresponding to the locations of the contacts. Specifically, the distal ends of the contacts extend through apertures 413. The distal ends of the contacts preferably reside within apertures 413, but could extend beyond apertures 413.

In a manner similar to that described in International Publication number WO 98/15991, apertures 413 can receive solder paste (not shown) provided during a squeegee operation. Thereafter, apertures 413, now filled with solder paste, can receive and temporarily retain a fusible element 409. A reflow operation then fuses solder balls 409 to the contacts. Any other manner of securing fusible elements 409 to the contacts could be used, however.

As with the earlier embodiments, connector 400 can mount to a substrate (not shown) having an array of conductive pads (not shown) connected to suitable traces (not shown) to transmit signals or for grounding purposes, for example. The pads correspond to the array of fusible elements 409 secured to the contacts on connector 400. As an alternative, the pads could also be vias.

A reflow process, typically subsequent to the reflow process that fused solder balls 409 to the contacts, fuses solder balls 409 to the pads. Typically, the pads have solder paste (not shown) thereon to accept and to temporarily secure solder balls 409 to the substrate. As described earlier, a squeegee drawn across a stencil (not shown) placed on the substrate provides suitable amounts of solder paste at desired locations. The reflow process fuses solder ball 409 to the pad on the substrate, thus creating an electrical path between the contacts and the substrate.

As with connector 300, connector 400 may require strain relief features to protect the solder joints formed between the contacts and the pads on the substrate. As with connector 300, connector 400 utilizes intrusive, solderable hold downs. Housing 401 can include posts 415 adjacent the four corners, or any other suitable location. When assembled, posts 415 extend past wafer 411 and reside within through holes (not shown) in the substrate. Preferably, posts 415 are made from a suitable solderable material such as metal or metallized plastic. Significantly, the diameter of posts 415 is smaller than the diameter of the through hole. Stated differently, posts 415 generally are unrestrained within the through holes prior to reflow. As discussed below, this allows solder balls 409 to self-center upon reflow without interference. Despite the ability of posts 415 to move within the through holes, posts 415 do, however, provide rough alignment and guidance when placing connector 400 on the substrate. In fact, posts 415 and PCB through holes are sized to ensure that solder balls 409 initially engage at least a portion of the solder pad.

The reflow process used to secure solder balls 409 to the substrate preferably also secures posts 415 to the through hole in the substrate. As with the conductive pads, the through holes receive solder paste during the squeegee operation. The reflow process fuses posts 415 to the substrate.

Posts 415 serve as the strain relief for connector 400. Despite being an intrusive hold down, posts 415 allow solder balls 409 to self-center during reflow. Prior to the reflow process, posts 415 extend into solder paste-filled through holes, while solder balls 409 rest upon solder paste on the conductive pads. During the heating stage of the reflow process, the solder paste tends to liquify before solder balls 409.

While liquid, solder balls 409 will self-center relative to the conductive pads on the substrate. Posts 415, being smaller than the through holes, allows movement of connector 400 without interference.

At the end of the reflow process posts 415 tend to cool more slowly than solder balls 409. As a result, the solder in this area strays liquid longer. This allows the benefit of an intrusive hold down, while retaining the self-centering characteristic of balls 409.

Figure 6A:
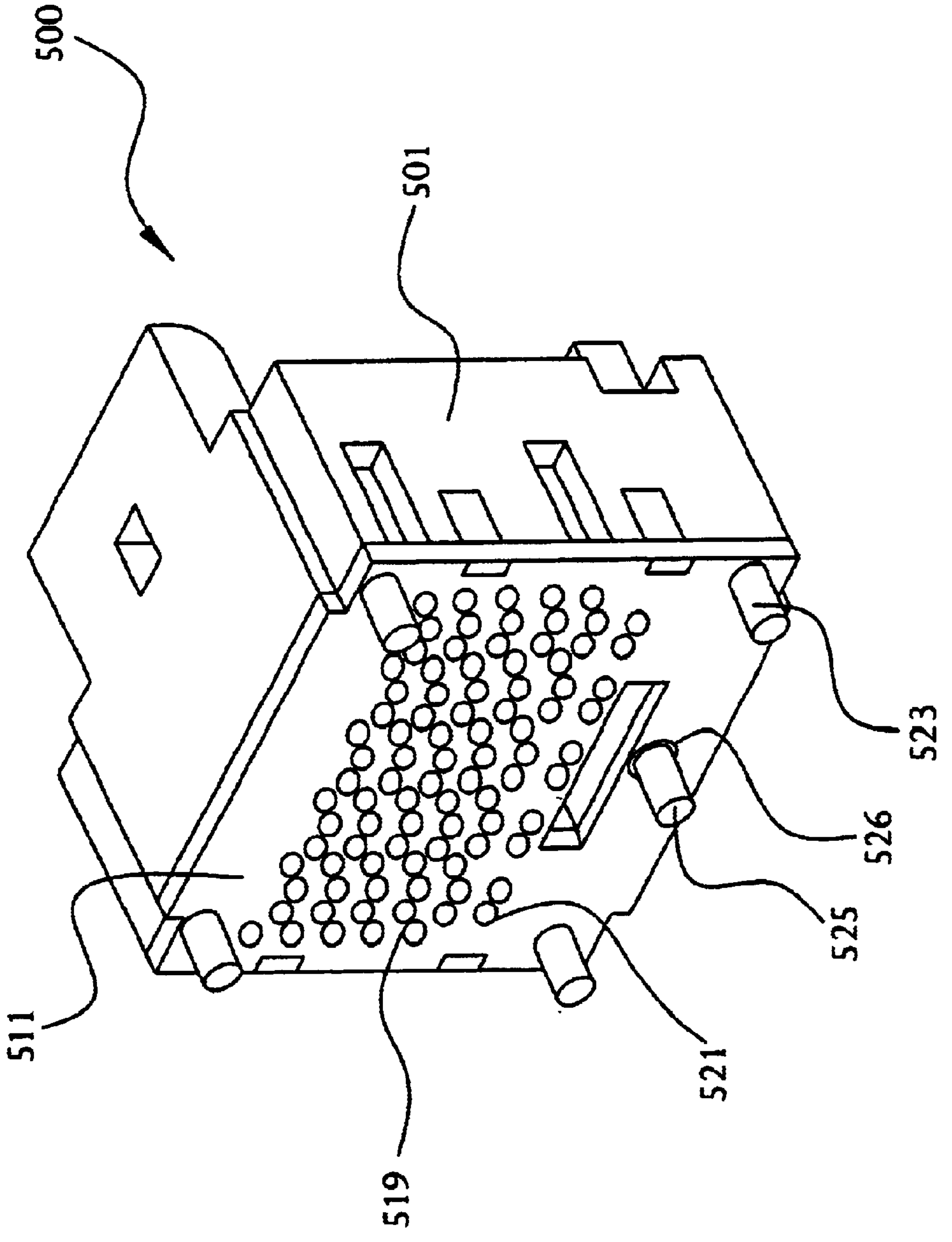
FIG. 6A is a bottom perspective view of a third alternative embodiment of the invention.
Figure 6B:
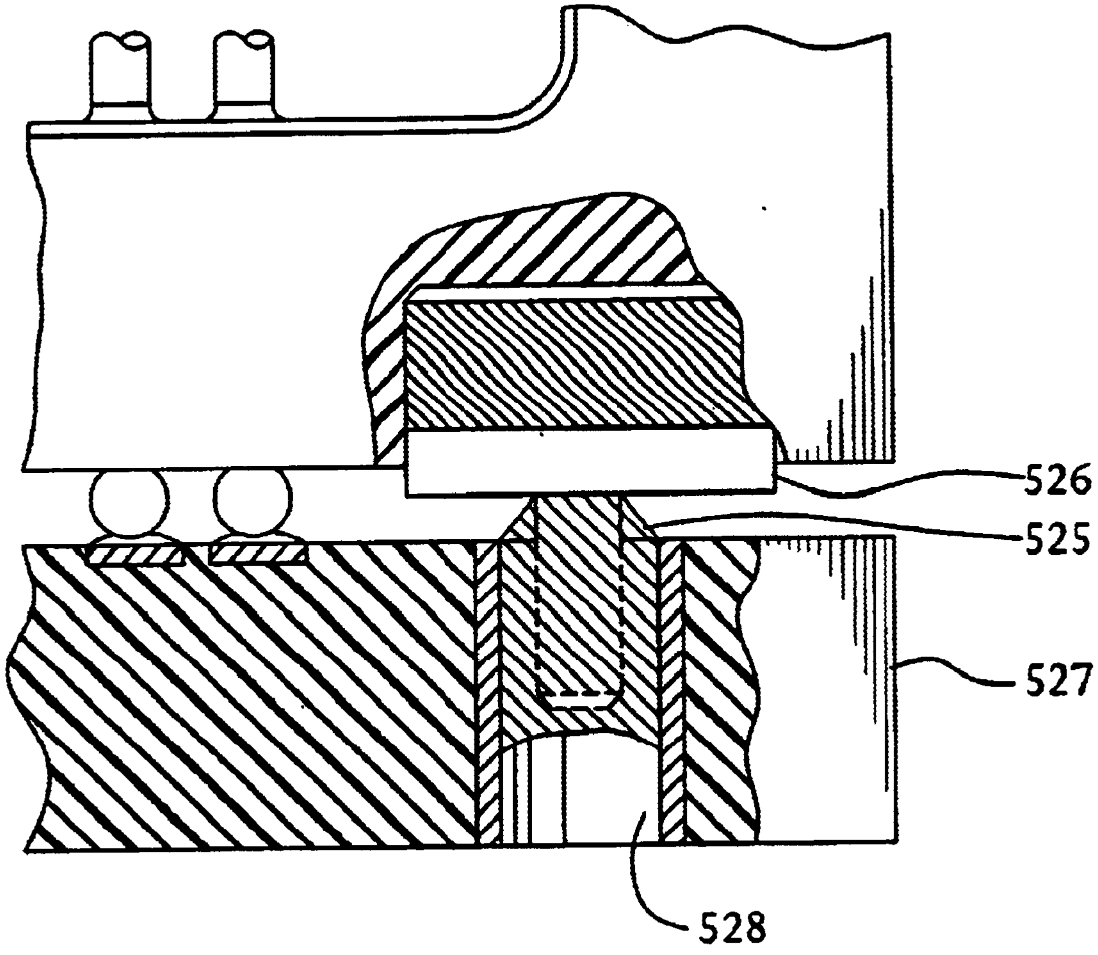
FIG. 6B is a partial cut-away view of the electrical connector in FIG. 6.

FIGS. 6A and 6B display electrical connector 500. In particular, FIG. 6A provides a bottom perspective view of electrical connector 500, and FIG. 6B provides a partial cut-away view of the connector. Connector 500, while generally similar to connector 300, is preferably used in situations, for example, where the weight of connector 500 may flatten solder balls 521 and cause bridging between adjacent solder balls 521.

Accordingly, housing 501 of connector 500 can include a retention post 525 in addition to, or as a substitute for, posts 523. Differenty than posts 523, post 525 has a shoulder 526 that cannot enter plated through holes 528. Shoulder 526 keeps connector 500 from substrate 527 when solder balls 521 liquefy to prevent bridging. In other words, a suitable post 525 acts as a standoff and prevents solder balls 521 from being flattened by the weight of the connector 500. As with posts 523, post 525 can be made from a solderable material. Preferably, shoulder 526 allows some flattening of the ball (e.g., up to approximately 40 percent and preferably approximately 30 percent) to ensure a proper solder joint with PCB pad. Shoulder 526 also can prevent skewing of connector 500 on substrate 527, caused, for example, by a connector that is not uniformly balanced. The distal end of post 525 can enter plated through hole 528 and serve as a hold-down.

Figure 7:
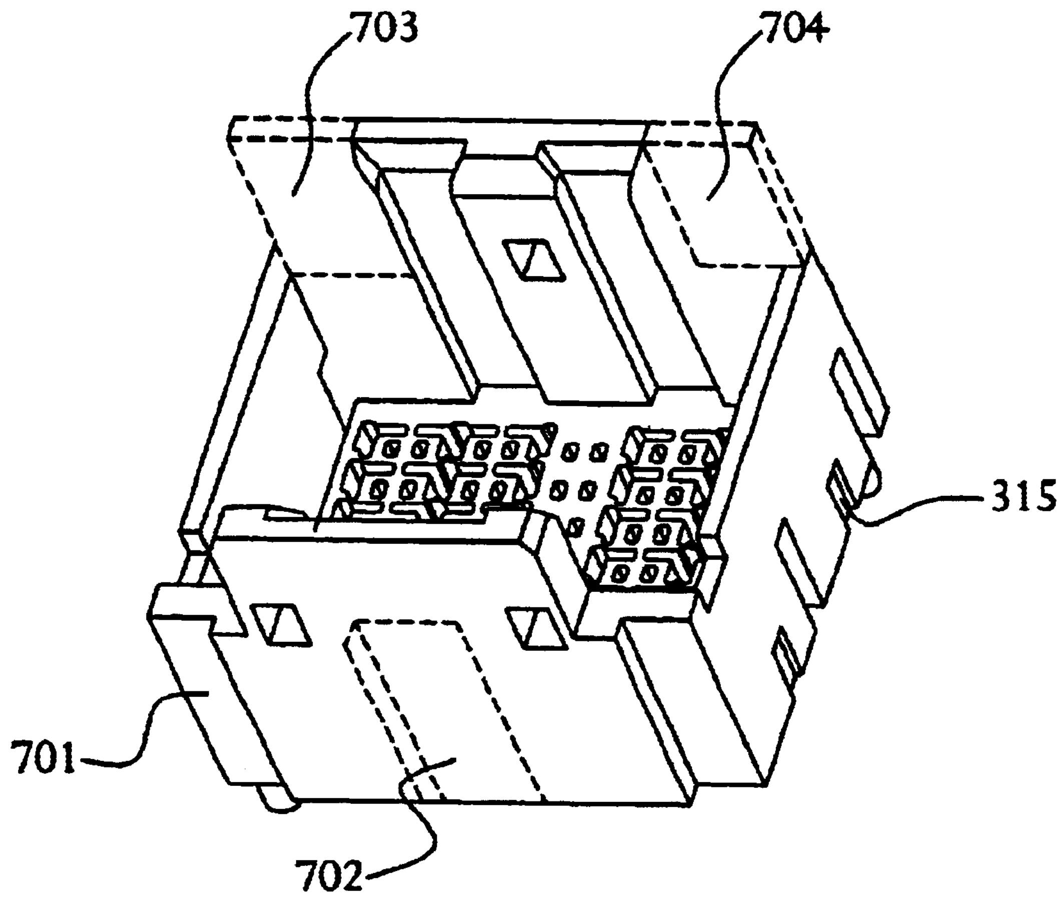
FIG. 7 is a perspective view of an electrical connector modified to ensure that the connector remains substantially parallel to the substrate during a reflow process, according to the invention.

FIG. 7 is another example of how the invention ensures that the BGA connector remains substantially parallel to the substrate during reflow. As discussed with reference to connectors 300, 400 and 500, the BGA connector is attached to the substrate by heating the solder balls until the solder melts and becomes fused to the conductive traces of the substrate. The surface tension of the solder centers the connector on the traces of the substrate. In situations where the connector design requires an arrangement where the weight of the connector is not uniformly balanced, the connector may become skewed with respect to the substrate during the reflow process. During reflow, a heavier portion of the connector could "flatten" the solder balls thereunder more so than the lighter portion. As a result, certain of the solder balls may not make proper contact with the substrate, possibly causing the solder joint to fail under a less than nominal mechanical force. Also, adjacent collapsed solder balls could bridge. The invention ensures that the BGA connector remains substantially parallel to the substrate during reflow.

As shown in FIG. 7, portions of connector 701 (shown dashed for purposes of clarity) may be added and/or removed to allow the mass of connector 701 to be evenly balanced over the ball grid array. In particular, a portion 702 may be removed from a heavier section of housing 701. Portions 703 and 704 may be added to lighter sections of housing 701. Although FIG. 7 shows portions 702–704 in certain locations, it should be appreciated that the location, as well as the size and weight of portions 702–704 will vary depending upon the physical characteristics of connector 701.

Although FIG. 7 illustrates balancing connector 701 on the substrate by modifying the physical characteristics of the connector, it should be appreciated that the invention is not so limited. The invention may accomplish such balancing using a number of techniques. For example, an external force may be applied to certain areas of connector 701 during the reflow process. The magnitude of such a force would be determined so as to overcome the skewed relation of connector 701 and the substrate, caused by the imbalance of the connector over the ball grid array. In another embodiment, a similar force may be applied to the substrate, in addition to or instead of the connector. Therefore, the invention includes any technique that overcomes the inherent imbalance of the connector over its ball grid array, and allows the connector to be substantially parallel with the attached substrate after reflow.

Figure 8A:
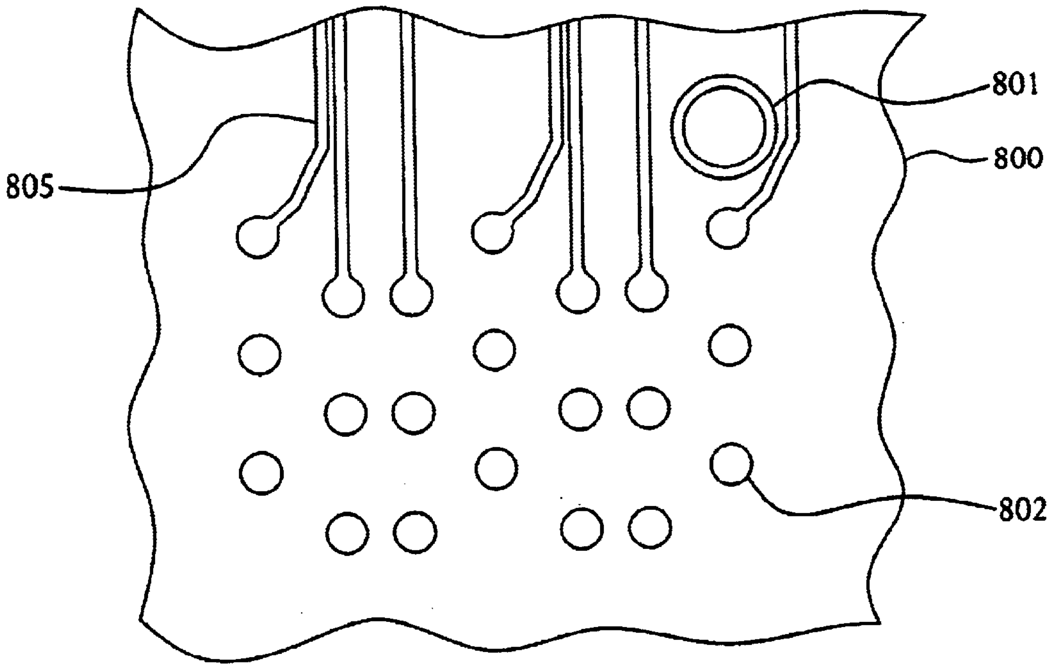
FIGS. 8A–8C show a portion of a substrate so as to illustrate the self-centering characteristics of the inventive connector.
Figure 8B:
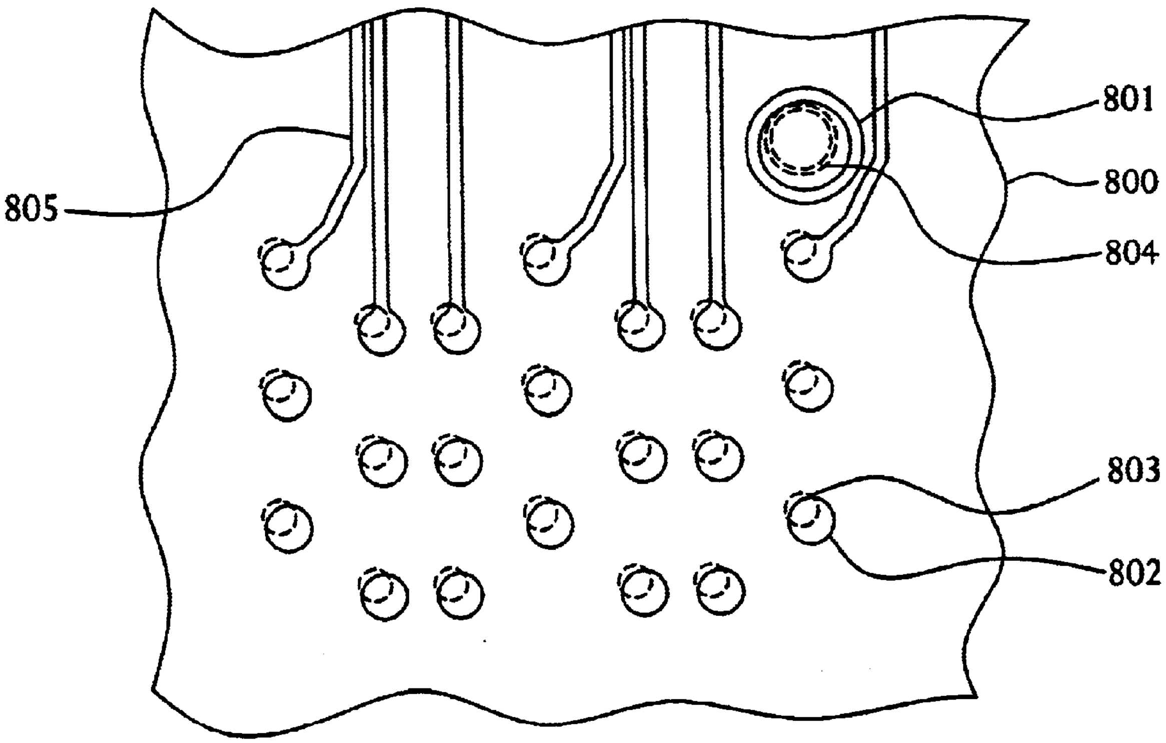
Figure 8C:
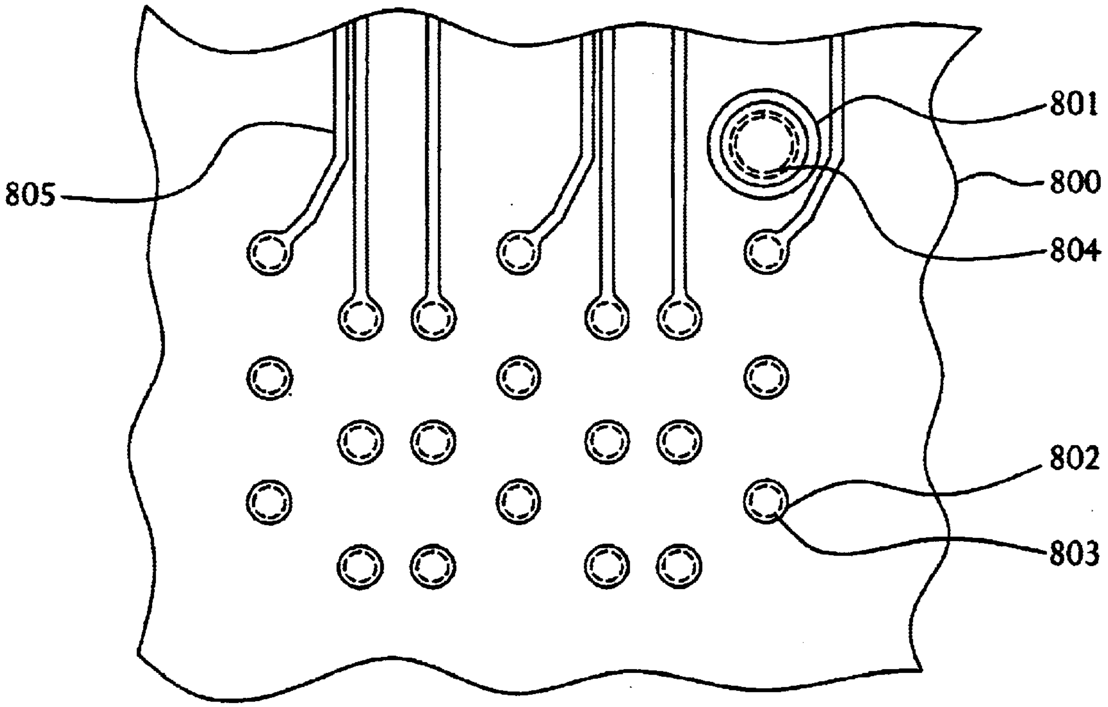

FIG. 8A–8C show a portion of a substrate 800, and illustrate the self-centering characteristics of the inventive connector during the reflow process. First, FIG. 8A shows substrate 800 without a connector soldered thereto. Substrate 800 includes plated through hole 801, solder pads 802, and conductive traces 805 (shown, for clarity, as only extending from certain pads 802). Solder pad 802 is adapted to receive a fusible element on a connector (e.g., as shown in FIG. 3), and conductive path 805 carries a signal along substrate 800. Through hole 801 is adapted to receive a hold down on the connector.

FIG. 8B illustrates the next step in the process, namely the positioning of the connector with solder balls 803 and hold downs 804 (shown dashed for clarity) on top of substrate 800. As shown in FIG. 8B, connector is positioned in a worst-case scenario with respect to substrate 800, such that solder balls 803 and hold downs 804 are furthest from the center of solder pads 802 and through hole 801, respectively. FIG. 8C illustrates the next step in the process, namely the reflow of solder balls 803 and the solder paste in the through holes that receive and hold downs 804. As shown in FIG. 8C, although solder balls 803 and hold downs 804 initially were positioned in a worst case scenario (as shown in FIG. 8B), the self-centering characteristic of the connector, moves solder balls 803 and hold downs 804 such that they are centered over solder pads 802 and within through hole 801, respectively. Therefore, regardless of the initial positioning of the connector over substrate 800, the self-centering characteristics of the reflow process permit solder balls 802 and hold downs 804 to center over solder pads 802 and within through hole 801, respectively.

While the invention has been described in connection with the preferred embodiments of the various figures, it is to be understood that other similar embodiments may be used or modifications and additions may be made to the described embodiment for performing the same function of the invention without deviating therefrom. Therefore, the invention should not be limited to any single embodiment, but rather construed in breadth and scope in accordance with the recitation of the appended claims.

What is claimed is:

1. A method of mounting an electrical connector to a substrate, comprising:

providing an electrical connector having a contact and a hold down;

providing a substrate having a pad;

securing said contact to said pad on said substrate during a reflow process;

placing said hold down into a hole in said substrate so as to permit said contact to center on said pad upon mounting to the substrate without contacting another pad on the substrate, wherein said hold down is adapted to retain said housing a distance from a surface of the substrate; and securing said hold down to said substrate during said reflow process, wherein said hold down is manufactured to secure to said substrate subsequent to said securing of said contact, wherein said hold down is adapted to limit flattening of said contact during said reflow process, and wherein said hold down and said reflow process enable said contact to move freely to center on and become secured to the pad during said reflow process while solder used for said securing the hold down remains substantially liquid.

2. The method as recited in claim 1, wherein said securing comprises soldering said hold down to said substrate.

3. The method as recited in claim 1, further comprising constructing said electrical connector such that it remains substantially parallel to the substrate when mounted thereon.

4. The method as recited in claim 1, further comprising balancing said electrical connector on said substrate such that said electrical connector remains substantially parallel to said substrate during said securing.

5. The method as recited in claim 1, wherein said electrical connector is a ball grid array connector.

* * * * *